United States Patent [19]

Hasegawa et al.

[11] Patent Number: 5,556,500
[45] Date of Patent: Sep. 17, 1996

[54] PLASMA ETCHING APPARATUS

[75] Inventors: Makoto Hasegawa, Kawasaki; Hiromi Sakima, Machida; Hiromitsu Kanbara, Kawasaki; Yoshio Ishikawa, Kofu; Yasuo Imamura, Yokohama; Makoto Aoki, Tama, all of Japan

[73] Assignees: Tokyo Electron Limited, Tokyo; Kabushiki Kaisha Toshiba, Kawasaki, both of Japan

[21] Appl. No.: 398,667

[22] Filed: Mar. 3, 1995

[30] Foreign Application Priority Data

Mar. 3, 1994 [JP] Japan .................................. 6-033645

[51] Int. Cl.$^6$ .................................................. H05H 1/00
[52] U.S. Cl. ........................... 156/345; 156/643.1; 216/71
[58] Field of Search ............................. 156/345, 643.1; 204/298.15, 298.31, 298.34; 118/723 E, 723 R, 723 ER; 216/71

[56] References Cited

U.S. PATENT DOCUMENTS

| | | |
|---|---|---|
| 4,350,578 | 9/1982 | Frieser et al. . |
| 4,771,730 | 9/1988 | Tezuka ........................... 156/345 X |
| 4,786,359 | 11/1988 | Stark et al. . |
| 4,793,975 | 12/1988 | Drage ............................ 156/345 X |
| 5,292,399 | 3/1994 | Lee et al. ...................... 156/345 X |
| 5,330,607 | 7/1994 | Nowicki ........................... 156/345 |

FOREIGN PATENT DOCUMENTS

| | | | |
|---|---|---|---|
| 224423 | 10/1986 | Japan .............................. 156/345 |
| 47131 | 2/1987 | Japan .............................. 156/345 |
| 89518 | 4/1989 | Japan .............................. 156/345 |

Primary Examiner—Thi Dang
Attorney, Agent, or Firm—Oblon, Spivak, McClelland, Maier, & Neustadt, P.C.

[57] ABSTRACT

An apparatus for etching a WSi film on a wafer by using a plasma of a gas containing a halogen element includes a vacuum process chamber in which upper and lower counter electrodes are provided. An electrostatic chuck is provided on a table at the center of a susceptor or the lower electrode. The wafer is held on the electrostatic chuck. A focus ring surrounding the wafer in a complementary manner is placed on a flange of the susceptor. The temperature of the wafer surface is set to be lower than that of the surface of the focus ring while the plasma is being generated. The focus ring comprises an inner part of amorphous carbon and an outer part of tungsten. While the plasma is being generated, a halide of tungsten generated from the outer part is diffused on the wafer surface, thereby correcting a distribution of the amount of the halide of tungsten on the wafer surface. Thus, the uniformity within the wafer surface of the etching rate and etching anisotropy is enhanced.

9 Claims, 8 Drawing Sheets

PLASMA ETCHING APPARATUS

BACKGROUND OF THE INVENTION

1. Field of the Invention

The present invention relates to a plasma etching apparatus for subjecting a substrate to be processed, such as a semiconductor wafer, to an etching process.

2. Description of the Related Art

A plasma etching apparatus is used to pattern an electrically conductive film for wiring, which is formed on a substrate such as a semiconductor wafer, an LCD substrate, etc. The plasma etching apparatus has a vacuum processing chamber (process chamber) for storing the substrate to be processed and defining a processing space. A pair of opposed upper and lower electrodes are provided within the process chamber, and a substrate to be processed, such as a semiconductor wafer, is placed on the lower electrode functioning as susceptor. A process gas (etching gas) is introduced into the process chamber and a high-frequency power is applied across the upper and lower electrodes. Then, the process gas is made into a plasma. Reactive ions in the plasma are pulled by a self-bias potential of the wafer, and an electrically conductive film formed on the wafer is etched and patterned.

A focus ring (electric field compensating ring) is provided to surround the wafer on the lower electrode, thereby to effectively direct the reactive ions onto the wafer. It is necessary that the focus ring have anti-corrosion properties (anti-chemical properties with high resistance to etching gas), anti-plasma properties, heat resistance and electrical conductivity. From this standpoint, a ring formed integrally of amorphous carbon is generally used as a focus ring.

In the plasma etching apparatus using the above focus ring, however, an etching rate and in-plane uniformity of etching anisotropy may deteriorate in some cases, depending on process conditions. Specifically, the etching rate is high at the peripheral portion of the wafer and low at the central portion thereof. In particular, this tendency is conspicuous when the temperature of the major surface of the wafer is set at high value, and the etching rate at the peripheral portion of the wafer is very high. In addition, under the circumstances, the etching anisotropy at the peripheral portion of the wafer deteriorates and side etching occurs in the patterning of the electrically conductive film. As a result, the width of the formed wiring becomes less than a set value.

The main factor of in-plane uniformity of the etching rate and etching anisotropy is considered to be the influence of a gas stream caused by exhaust in the process chamber during etching. The gas stream is led downward from above the lower electrode through a region surrounding the lower electrode. Thus, a great deal of fresh process gas is led to the peripheral portion of the wafer, whereas the gas stream stagnates at the central portion thereof. A less quantity of fresh process gas reaches the central portion of the wafer. As a result, an etching mechanism differs between the peripheral portion and central portion of the wafer, and the etching rate and etching anisotropy become non-uniform.

SUMMARY OF THE INVENTION

An object of the present invention is to provide a plasma etching apparatus capable of obtaining a uniform etching rate and a uniform anisotropy over the entire surface of a substrate to be processed.

According to a first aspect of the invention, there is provided an apparatus for etching an etching target on a major surface of a substrate by using a plasma, comprising:

a process chamber defining a vacuum process space for containing and processing the substrate;

a supply system for introducing an etching gas to be made into a plasma into the process chamber;

an exhaust system for exhausting the process chamber;

a pair of counter electrodes provided within the process chamber and opposed to each other;

a support member, provided within the process chamber, for supporting the substrate such that the major surface is exposed within the process space;

a power supply for applying a voltage between the counter electrodes so as to generate an electric field for making the etching gas into a plasma; and a source member having a surrounding surface exposed to the process space and surrounding the major surface of the substrate, the source member being formed of a material containing a component which is a main component of the etching target and produces such a reaction product as to be substantially adsorbed on the etching target by contact with the etching gas, so that the reaction product generated from the surrounding surface diffuses to the major surface of the substrate while the plasma is being generated, thereby correcting a distribution of the amount of the reaction product on the major surface.

According to a second aspect of the invention, there is provided an apparatus for etching an etching target on a major surface of a substrate by using a plasma, comprising:

a process chamber defining a vacuum process space for containing and processing the substrate;

a supply system for introducing an etching gas to be made into a plasma into the process chamber;

an exhaust system for exhausting the process chamber;

a pair of counter electrodes provided within the process chamber and opposed to each other;

a support member, provided within the process chamber, for supporting the substrate such that the major surface is exposed within the process space;

a power supply for applying a voltage between the counter electrodes so as to generate an electric field for making the etching gas into a plasma; and a focus ring having a surface surrounding the major surface of the substrate, the surface of the focus ring comprising first and second surrounding surfaces exposed to the process space and located inside and outside, respectively, the first surrounding surface being formed of an electrically conductive material which produces no such a reaction product as to be substantially adsorbed on the etching target by contact with the etching gas, the second surrounding surface being formed of a material containing a component which is a main component of the etching target and produces such a reaction product as to be substantially adsorbed on the etching target by contact with the etching gas, so that the reaction product generated from the second surrounding surface diffuses to the major surface of the substrate while the plasma is being generated, thereby correcting a distribution of the amount of the reaction product on the major surface.

DETAILED DESCRIPTION OF THE PREFERRED EMBODIMENTS

Figure 1:
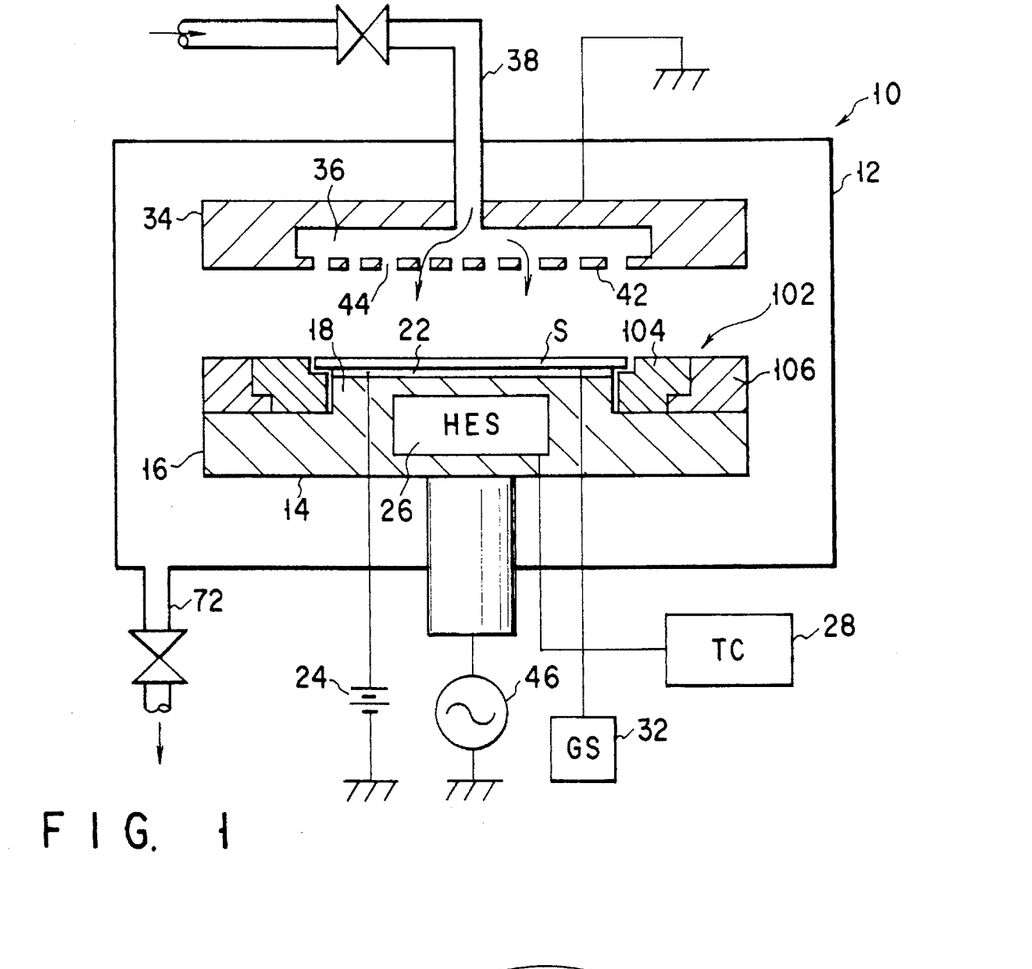
FIG. 1 is a cross-sectional view schematically showing a plasma etching apparatus according to a first embodiment of the present invention.

FIG. 1 is a cross-sectional view schematically showing a plasma etching apparatus according to the first embodiment of the present invention.

The plasma etching apparatus 10 includes an electrically conductive, airtight vacuum processing chamber (process chamber) 12 for storing a wafer S or a substrate to be processed and defining a processing space. The wall of the process chamber 12 is formed of an electrically conductive material such as an aluminum material having an alumite surface. A susceptor 14 for supporting the wafer S, which is formed of an electrically conductive material such as an aluminum material having an alumite surface, is disposed at a center region of the process chamber 12.

Figure 2:
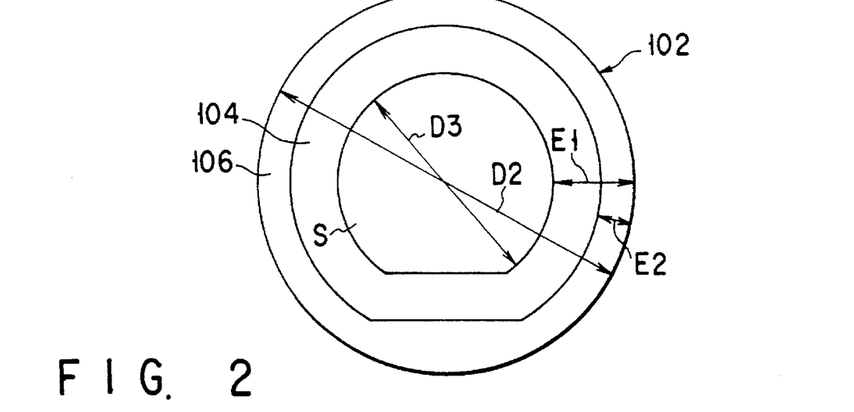
FIG. 2 is a plan view showing the relationship between a wafer and a focus ring of the apparatus shown in FIG. 1.

The susceptor 14 has a circular, flat shape and includes a peripheral flange portion 16 and a columnar table 18 projecting upwards at the central area of the susceptor 14. The upper surface of the table 18 is flat. An electrostatic chuck 22 for attracting and holding the wafer S by Coulomb force is provided on the upper surface of the table 18. The electrostatic chuck 22 has a structure wherein an electrically conductive layer formed of, e.g. an electrolytic copper foil is sandwiched by upper and lower insulating layers of a polyimide film. The electrically conductive layer is connected to a DC power supply 24 provided outside the process chamber 12, and a DC voltage of, e.g. 2.0 kV is applied to the electrically conductive layer. As is shown in FIG. 2, a focus ring 102 surrounding the wafer S substantially concentrically in a complementary manner is placed on the flange portion 16 of the susceptor 14. The focus ring 102 will be described later in greater detail.

A heat exchange source 26 for setting the temperature of the wafer S is provided within the susceptor 14. The heat exchange source 26 is connected to a controller 28 provided outside the process chamber 12. The controller 28 controls the temperature of the wafer by means of the heat exchange source 26. As will be described later, the heat exchange source 26 may be constituted by using a combination of a cooler for supplying a refrigerant such as liquid nitrogen to a space within the susceptor 14 and a heater such as a ceramic heater.

An inert gas such as helium can be selectively supplied from a gas source 32 provided outside the process chamber 12 into a gap between the bottom surface of the wafer S and the upper surface of the electrostatic chuck 22. The inert gas functions as heat transfer medium and contributes to heat transmission between the susceptor 14 and wafer S during etching performed within a vacuum atmosphere.

A gas supply head 34 formed of an electrically conductive material such as amorphous carbon, SiC or an aluminum material having an alumite surface is provided above the susceptor 14 within the process chamber 12. The head 34 includes a space 36 for temporarily storing a process gas such as an etching gas. The space 36 is made to communicate with gas sources via a supply pipe 38. A lower part of the head 34 is formed as a diffusion plate 42 with many diffusion holes 44. The process gas within the space 36 is supplied uniformly to the wafer S via the diffusion holes 44.

The diffusion plate 42 of the head 34 and the susceptor 14 function as parallel, flat plate-type upper and lower electrodes. The susceptor 14 or the lower electrode is connected to a high frequency power supply 46 via a capacitor and a matching circuit. The diffusion plate 42 or the upper electrode is grounded. At the time of etching, the distance between the upper and lower electrodes 42 and 14 is set at about 15 to 20 mm. A high-frequency voltage of, e.g. 13.56 MHz is applied from the power supply 46 between the upper and lower electrodes 42 and 14. Thereby, an electric field is generated between the upper and lower electrodes 42 and 14.

Figure 3:
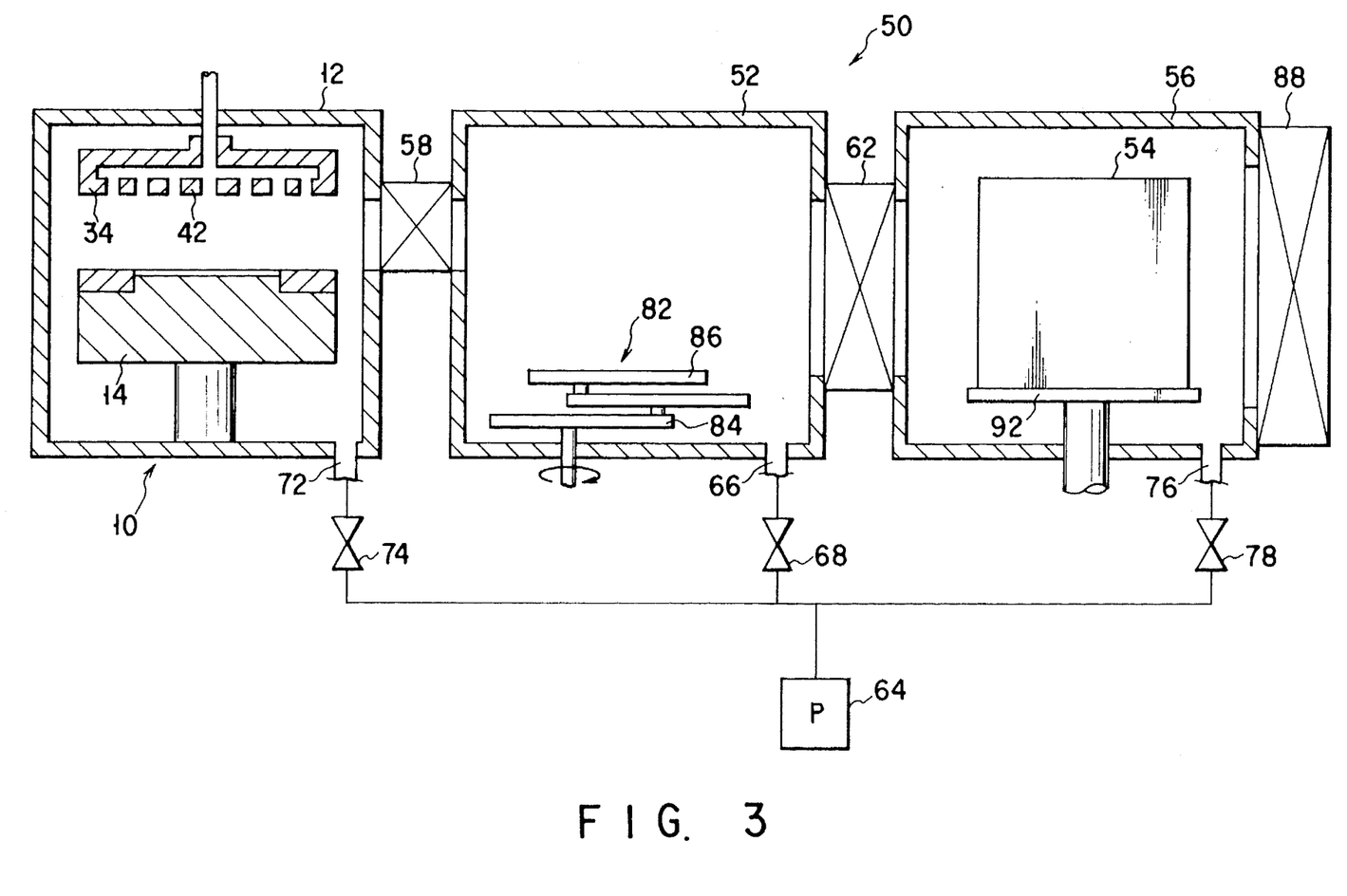
FIG. 3 is a cross-sectional view schematically showing an etching system including the apparatus shown in FIG. 1.

10 FIG. 3 is a vertical cross-sectional side view schematically showing an etching system 50 including the plasma etching apparatus 10 as shown in FIG. 1.

The etching system 50 includes a transfer chamber 52, the pressure of the atmosphere within which can be set at a negative level. The transfer chamber 52 is connected to the process chamber 12 of the abovedescribed etching apparatus 10 and to a cassette chamber 56 for storing wafers in units of a cassette 54. A connection path between the transfer chamber 52 and the process chamber 12 is opened and closed by a gate valve 58, and a connection path between the transfer chamber 52 and the cassette chamber 56 is opened and closed by a gate valve 62.

When the gate valves 58 and 62 are closed, the transfer chamber 52, process chamber 12 and cassette chamber 56 have independent airtight spaces. The transfer chamber 52, process chamber 12 and cassette chamber 56 are evacuated independently by a common exhaust device 64 such as a turbo molecular pump or a dry pump, and the pressure of the atmosphere within each chamber can be set at a negative level, e.g. $10^{-5}$ Torr to $10^{-1}$ Torr. An exhaust line 66 of the transfer chamber 52 is opened and closed by a valve 68. An exhaust line 72 of the process chamber 12 is opened and closed by a valve 74. An exhaust line 76 of the cassette chamber 56 is opened and closed by a valve 78. 10 A transfer device 82 for transferring a wafer is provided within the transfer chamber 52. In the present embodiment, the transfer device 82 comprises a multi-joint arm device including a vertically movable and rotatable base 84 and an extendible transfer arm 86 attached on the base 84. The surface of the transfer arm 86 is coated with electrically conductive Teflon, etc. as an electrostatic countermeasure.

The cassette chamber 56 includes an opening, formed in a side wall opposed to the connection path to the transfer chamber 52, for taking in and out the wafer cassette 54, and a gate valve 88 for airtightly closing the opening. A turntable 92 for supporting the cassette 54 is disposed within the cassette chamber 56. This structure is suitable for conveying the cassette 54 into the cassette chamber 56 by means of a transfer robot (not shown). The cassette 54 contains a predetermined number of wafers S or substrates to be processed, e.g. 25 wafers S, at vertically regular intervals. The wafers S are taken out of the cassette 54 and inserted into the cassette 54 one by one by the transfer device 82 within the transfer chamber 52.

A description will now be given of a process of etching a tungsten film on the wafer S by means of the etching system shown in FIG. 3.

The cassette 54 storing 25 wafers S is introduced into the cassette chamber 56 and the gate valve 88 is 10 closed. Then, the exhaust valve 78 of the cassette chamber 56 is opened and the internal pressure of the cassette chamber 56 is reduced by the exhaust device 64 to, e.g. $10^{-1}$ Torr.

Subsequently, the gate valve 62 of the cassette chamber 56 is opened and a predetermined number of wafers S are taken out of the cassette 54 one by one by means of the transfer device 82 and transferred into the transfer chamber 52. Thereafter, the exhaust valve 68 of the transfer chamber 52 is opened and the internal pressure of the transfer cassette chamber 52 is reduced by the exhaust device 64 to, e.g. $10^{-2}$ Torr.

The gate valve 58 of the process chamber 12 is then opened and one wafer S is introduced into the process chamber 12 by the transfer device 82. The focus ring 102 is set at a predetermined position prior to introduction of the wafer S. The wafer S is placed on the electrostatic chuck 22 and, after the transfer device 82 is retreated into the transfer chamber 52, the gate valve 58 is closed. A DC voltage is applied from the power supply 24 and the wafer S is attracted and held on the electrostatic chuck 22.

Subsequently, the exhaust valve 74 of the process chamber 12 is opened and the internal pressure of the process chamber 12 is reduced by the exhaust device 64. At the same time, a process gas, e.g. $Cl_2/SF_6$ or an etching gas is supplied into the process chamber 12 from the introducing pipe 38 via the head space 36 and diffusion holes 44. Thereby, the internal pressure of the process chamber 12 is set and kept at, e.g. $10^{-3}$ Torr.

Following the above, a high-frequency power of 13.56 MHz is applied from the power supply 46 between the upper and lower electrodes 34 and 14. Thereby, the process gas is made into a plasma between the upper and lower electrodes 34 and 14 and the reactive ions in the plasma are accelerated and made to impinge upon the tungsten film on the wafer S. Thus, anisotropic etching is effected.

After the etching process for a predetermined time period, the generation of the plasma is halted and the internal atmosphere of the process chamber 12 is replaced with an inert gas. The processed wafer S is taken out of the process chamber 12 by the transfer device 82 in the order of steps reverse to that described above. The processed wafer S is then inserted into the cassette 54 within the cassette chamber 56.

The relationship among the susceptor 14, wafer S and focus ring 102 will now be described in detail.

Figure 4:
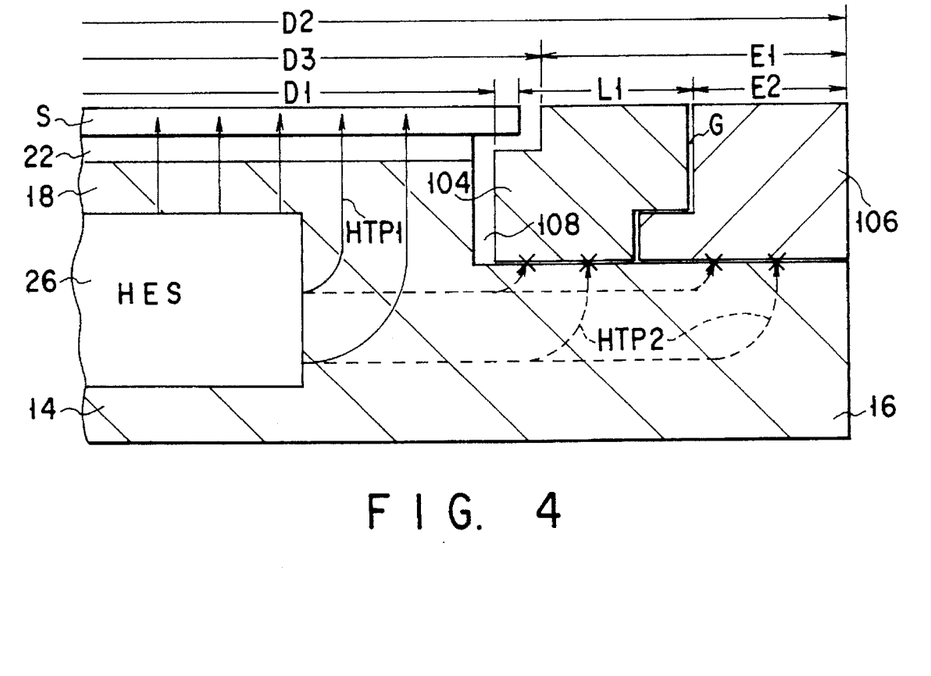
FIG. 4 is a partly enlarged cross-sectional view of the susceptor and focus ring of the apparatus shown in FIG. 1.

As is shown in FIG. 4, the diameter of the upper surface of the table 18 of the susceptor 14 and the diameter of the electrostatic chuck 22 are each less than the diameter of the wafer S. Accordingly, in the state in which the wafer S is placed on a predetermined position on the table 18, the edge of the wafer S projects outside the periphery of the upper surface of the table 18. For example, if the size of the wafer S is 8 inches (diameter: 200 mm), the diameter of the table 18 and that of the upper surface thereof is 195 mm to 198 mm.

The focusing ring 102 is placed on the flange 16 of the susceptor 14 and surrounds the wafer S in a substantially complementary manner. The diameter or inside diameter D1 of the opening 108 of the focusing ring 102 is slightly greater than the diameter of the table 18. For example, if the diameter of the wafer S is 8 inches, the diameter D1 is 196 mm to 199 mm. The outside diameter D2 of the focusing ring 102 is set at 230 mm to 300 mm in accordance with a process. One of the functions of the focus ring 102 is to prevent diffusion of plasma and make reactive ions of the process gas effectively incident on the wafer S. If the wafer S has an orientation flat, as shown in FIG. 2, it is desirable that the inner edge of the upper surface of the focus ring 102 has a shape similar to that of the wafer S.

The focus ring 102 has a construction of a combination of inner and outer annular parts 104 and 106. The inside diameter D1 and outside diameter D2 of the focus ring 102 are defined by the annular inner and outer parts 104 and 106. As is shown in FIG. 4, a gap G of 10 about 1 mm in the radial direction is provided between the inner and outer parts 104 and 106, in consideration of mutual thermal expansion. The inner and outer parts 104 and 106 have complementary L-cross sections, so that no plasma reaches the susceptor 12 through the gap G, and the inner and outer parts 104 and 106 are superposed on each other and connected to each other. The inner and outer parts 104 and 106 have upper surfaces which are flush with the major surface of the wafer S. The surface roughness of the upper surfaces of the inner and outer parts 104 and 106 is set at 1.6 μm or less on average. The surface roughness is greater than this value, dust may easily adhere and the adhered dust is difficult to remove.

The inner part 104 is made of a carbon-based material such as amorphous carbon or SiC, for example, like the conventional focus ring. The inner part 104 has a stepped upper edge portion of the circular opening 108. THUS, the inner part 104 has a first portion 112 having an upper surface flush with the major surface of the wafer S and a second portion 114 having an upper surface lower than the bottom surface of the wafer S, for example, by about 1 to 1 mm.

The inside diameter D3 of the first portion 112 of the inner part 104 is greater than the diameter of the wafer S by about 1 to 2 mm. For example, when the size of the wafer S is 8 inches, the diameter D3 is set at 201 mm to 202 mm. On the other hand, the second portion 114 of the inner part 104 is situated in a gap between the wafer S projecting radially outside the upper surface of the table 18 and the flange 16 of the susceptor 14. The projection of the second part 114 can prevent a local charge-up phenomenon at the peripheral portion of the wafer S.

The outer part 106 is formed of a material having a main component, which is at least partially common to the material of a specific etching target. For example, when an electrically conductive film of W (tungsten) or WSi (tungsten silicide) for wiring is to be etched, it is desirable that the outer part 106 be formed of tungsten. Thus, the amount of a remaining reaction product per unit area is substantially equalized between a peripheral portion and a central portion of the wafer S during the etching process, and the in-plane uniformity of etching characteristics such as an etching rate, etching anisotropy, etc. is enhanced.

As has been state above, the reaction product elimination rate differs between the peripheral portion and central portion of the wafer S due to the influence of a gas stream occurring within the process chamber 12 during the etching process. The reaction product is adsorbed on the surface of the etching object and functions as a temporary protection film or etching prevention film. Thus, the amount of the remaining reaction product per unit area is an important factor which determines the etching rate and etching anisotropy.

From the standpoint of the above, experiments were conducted on various focus ring samples F1 to F4, with a WSi film being used as an etching target, which was formed on an 8-inch silicon wafer (diameter: 200 mm).

Each of all samples F1 to F4 as used has an inside diameter of 196 mm, an outside diameter of 260 mm and a width of 32 mm. The upper surface thereof is slightly below the bottom surface of the wafer. The sample F1 is entirely formed of amorphous carbon, and the sample F2 is entirely formed of tungsten. The samples F3 and F4 relate to this embodiment of the present invention. Each of the samples F3 and F4 comprises an inner part formed of an amorphous carbon ring and an outer part formed of a tungsten ring. The outer parts of the samples F3 and F4 have inside diameters of 230 mm and 246 mm, respectively.

Figure 5:
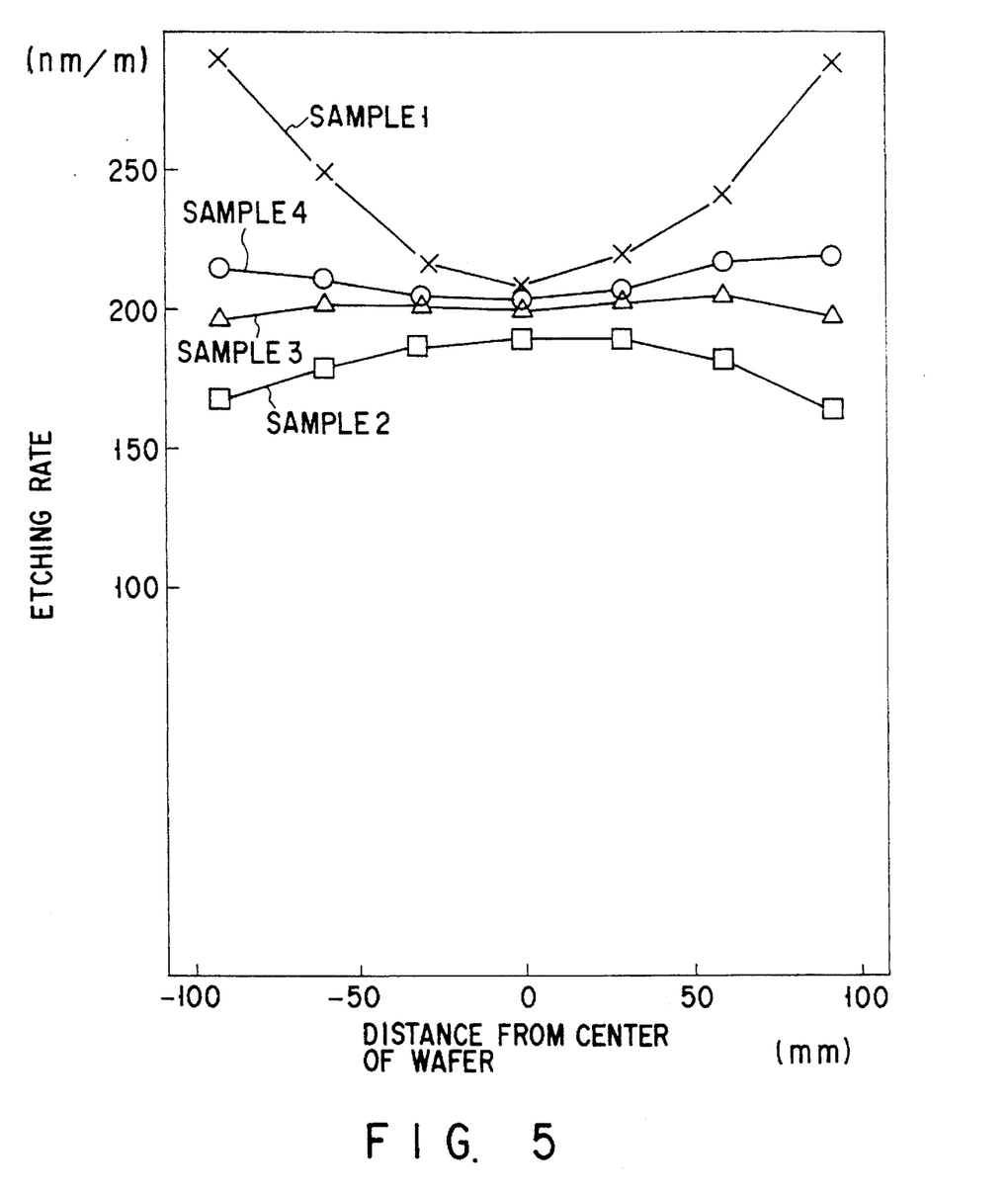
FIG. 5 is a graph showing experimental results relating to etching processes performed by using various focus ring samples.

The samples F1 to F4 were used, and the WSi film on the entire surface of the wafer S was etched with the wafer set temperature of 60° C., the process pressure of 9 mTorr and RF power of 250 W, while the process gas of $Cl_2/SF_6$ being supplied at a flow rate of 55/13 SCCM. FIG. 5 shows the results of the experiments.

As is shown in FIG. 5, when the sample F1 formed of a conventional typical material alone was used, the etching rate was very high at a peripheral portion of the wafer S. By contrast, when the sample F2 was used, the etching rate was low at the peripheral portion of the wafer S but the in-plane uniformity of the etching rate was enhanced. On the other hand, when the samples F3 and F4 according to the present invention were used, the problem with the sample F2 was solved and the inplane uniformity of the etching rate was further improved.

It is considered that the in-plane uniformity of the etching rate in the samples F2, F3 and F4 was enhanced for the following reason. When a W film or a WSi film is etched with a process gas such as $NF_3$, $SF_6$, $Cl_2$ each including a halogen element, a halide of tungsten is produced as a reaction product. Similarly, an exposed W portion on the surface of the focus ring reacts with the process gas and a halide of tungsten is produced. These reaction products are adsorbed on the surface of the etching target and function to lower the etching rate and enhance the etching anisotropy. In other words, the peripheral portion of the wafer S, at which the rate of elimination of the reaction product is high due to the influence of the gas stream, is provided with a similar reaction product from the focus ring by diffusion, the in-plane uniformity of the etching rate and etching anisotropy between the peripheral portion and central portion of the wafer can be enhanced.

However, the in-plane uniformity of the etching rate differs among the samples F2, F3 and F4. To find the reason for this, further experiments were conducted. As a result, it has been found that in the etching apparatuses as shown in FIGS. 1 and 4, a difference appears in temperature between the wafer S and focus ring 102 during etching, and this difference affects the mechanism of the etching. After generation of the plasma, the wafer S is cooled by the heat exchange source 26 controlled by the controller 28 and the rise in temperature is prevented, whereas the focus ring 102 is not substantially cooled by the heat exchange source 26 and the temperature thereof rises steeply due to the influence of the plasma.

More specifically, as shown in FIG. 4, a heat transmission path HTP1 is maintained even in the vacuum atmosphere between the heat exchange source 26 within the susceptor 14 and the wafer S. This is because, during the etching process, an inert gas functioning as a heat transmission medium is supplied from the gas source 32 into the gap between the electrostatic chuck 22 and the bottom surface of the wafer S. In addition, even in the case where the susceptor 14 comprises a plurality of parts and gaps are present among the parts, a heat transmission medium is supplied to these gaps.

By contrast, a heat transmission path HTP2 between the heat exchange source 26 within the susceptor 14 and the focus ring 102 is substantially cut off in the vacuum atmosphere in which the etching process is performed. Specifically, a gap is present between the flange 16 of the susceptor 14 and the focus ring 102 placed thereon and this gap is set in substantially the same reduced pressure state as in the vacuum atmosphere in which the etching process is performed. In other words, the heat transmission path HTP2 is cut off between the flange 16 and the focus ring 102 during the etching process, except at point contact portions.

It is considered that the etching rate at the peripheral portion of the wafer S of the focus ring sample F2 formed entirely of tungsten decreased because of overheating of the above-mentioned focus ring sample F2. In other words, a great deal of reaction product was produced from the overheated focus ring sample F2, and the reaction product excessively curbed the etching at the adjacent peripheral portion of the wafer.

By contrast, in the samples F3 and F4, there is a distance between the wafer S and the outer part of the tungsten ring. Thus, part of the reaction product produced from the overheated outer part is exhausted without reaching the peripheral portion of the wafer S. In addition, no reaction product, which may adhere to the etching target is produced from the inner part of amorphous carbon. For these reasons, the amount of remaining reaction product per unit area is close between the peripheral portion and central portion of the wafer in the samples F3 and F4 and the in-plane uniformity of etching characteristics is enhanced.

From the above standpoint, experiments were conducted, as shown in Table 1, on various processes of processing electrically conductive metal films for wiring with etching gases containing halogen elements, with use of the etching apparatus shown in FIG. 1, and desirable modes of the focus ring were examined. Taking the actual process into account, the set temperature of the major surface of the wafer S used in the experiments was room temperature (e.g. 25° C.) to 150° C. In this temperature range, a temperature difference $\Delta T(°C.)$ between the major surface of the wafer S and the upper surface of the focus ring 102 was 50° C. to 100° C.

TABLE 1

| TARGET | ETCHING GAS | OUTER PART |
|---|---|---|
| W, WSi | $NF_3$, $SF_6$, $Cl_2$ | W |
| Ti, TiSi, TiN | $Cl_2$, HBr | Ti |
| Al, Al—Si—Cu | $Cl_2$, $BCl_3$ | Al |

The conditions for obtaining good in-plane uniformity of etching characteristics under the above temperature condition were that the distance L1 between the edge of the wafer S and the inner edge of the outer part 106 along the upper surface or exposed surface of the focus ring 102 is 5 mm to 30 mm, preferably 15 mm to 25 mm, and that the width E2 of the exposed surface of the outer part is 5 mm or more. It was also found that the focus ring 102 of the present invention was particularly effective when the etching target was uniformly distributed over the substantially entire surface of the wafer S.

The distance L1 varied, depending on the temperature difference $\Delta T(°C.)$. The greater the difference $\Delta T$, the greater the desired value of the distance L1. However, the distance L1 was not substantially influenced by the size of the wafer. The upper limit of the width E2 was determined in consideration of the sizes of the process chamber 12 and the susceptor 14, rather than the etching characteristics. For example, in the case of an 8-inch wafer, the width E2 should desirably be 50 mm or less.

Furthermore, an examination was made on the ratio E2/E1 of the width E2 of the outer part 106 to the width E1 of the focus ring 102 on the upper surface or exposed surface of the focus ring 102. As a result, it has been found that in the case of the 8-inch wafer, the ratio E2/E1=0.15 to 0.75, preferably, E2/E1=0.25 to 0.75, may be used.

As has been described above, the in-plane uniformity of etching characteristics such as etching rate and etching anisotropy can be improved by employing the focus ring 102 comprising a compound structure of inner and outer parts 104 and 106 and selecting the specific materials of the inner and outer parts. The inner part is formed of an electrically conductive material, e.g. amorphous carbon, which causes substantially no reaction product by contact with an etching gas, or an electrically conductive material which does not cause, at least, any reaction product which is substantially adsorbed on an etching target, by contact with an etching gas. The outer part is formed of a material containing a component which is a main component of the etching target and causes such a reaction product as to be substantially adsorbed on the etching target by contact with an etching gas, preferably, a metallic material.

Figure 6:
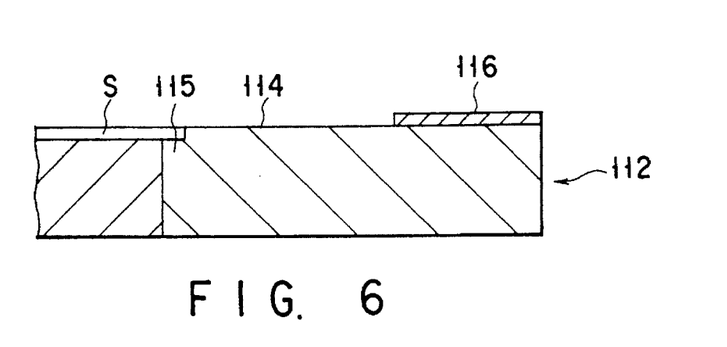
FIG. 6 is a partly enlarged cross-sectional view showing a modification of the focus ring.

FIG. 6 shows a modification of the focus ring 102. In a focus ring 112 shown in FIG. 6, an annular base part 114 formed of amorphous carbon, etc., which corresponds to the inner part 104 of the focus ring 102 shown in FIG. 4, extends over the entire width of the focus ring 112. An annular thin plate part 116 formed of tungsten, etc., which corresponds to the outer part 106 of the focus ring 102 shown in FIG. 4, is placed and attached on an outer circular surface of the base part 114. The upper surface of the base part 114 is flush with the major surface of the wafer S. An inside upper edge of the base part 114 is stepped downward, and an integral extension portion 115 underlies the wafer S to prevent a charge-up phenomenon of the peripheral portion of the wafer S.

Figure 7:
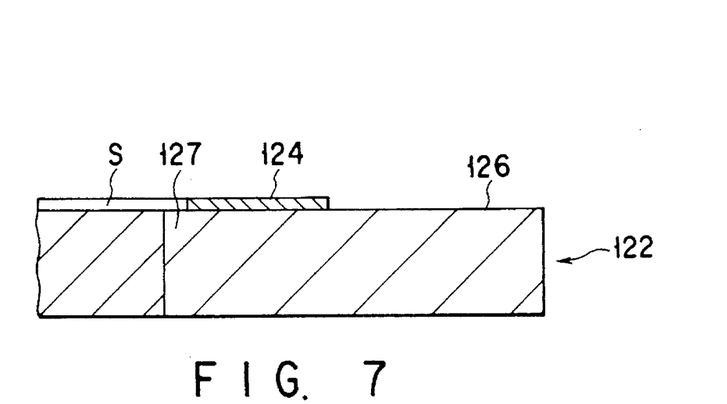
FIG. 7 is a partly enlarged cross-sectional view showing another modification of the focus ring.

FIG. 7 shows another modification of the focus ring 102. In a focus ring 122 shown in FIG. 7, an annular base part 126 formed of tungsten, etc., which corresponds to the outer part 106 of the focus ring 102 shown in FIG. 4, extends over the entire width of the focus ring 122. An annular thin plate part 124 formed of amorphous carbon, etc., which corresponds to the inner part 104 of the focus ring 102 shown in FIG. 4, is placed and attached on an inner circular surface of the base part 126. The upper surface of the thin plate part 124 is flush with the major surface of the wafer S. An inner edge portion 127 of the base part 126 underlies the wafer S to prevent a charge-up phenomenon of a peripheral portion of the wafer S.

In FIGS. 4, 6 and 7, the outer part of the focus ring has an annular shape. However, the outer part may be constituted by a plurality of segments, arranged circumferentially at intervals.

Figure 8:
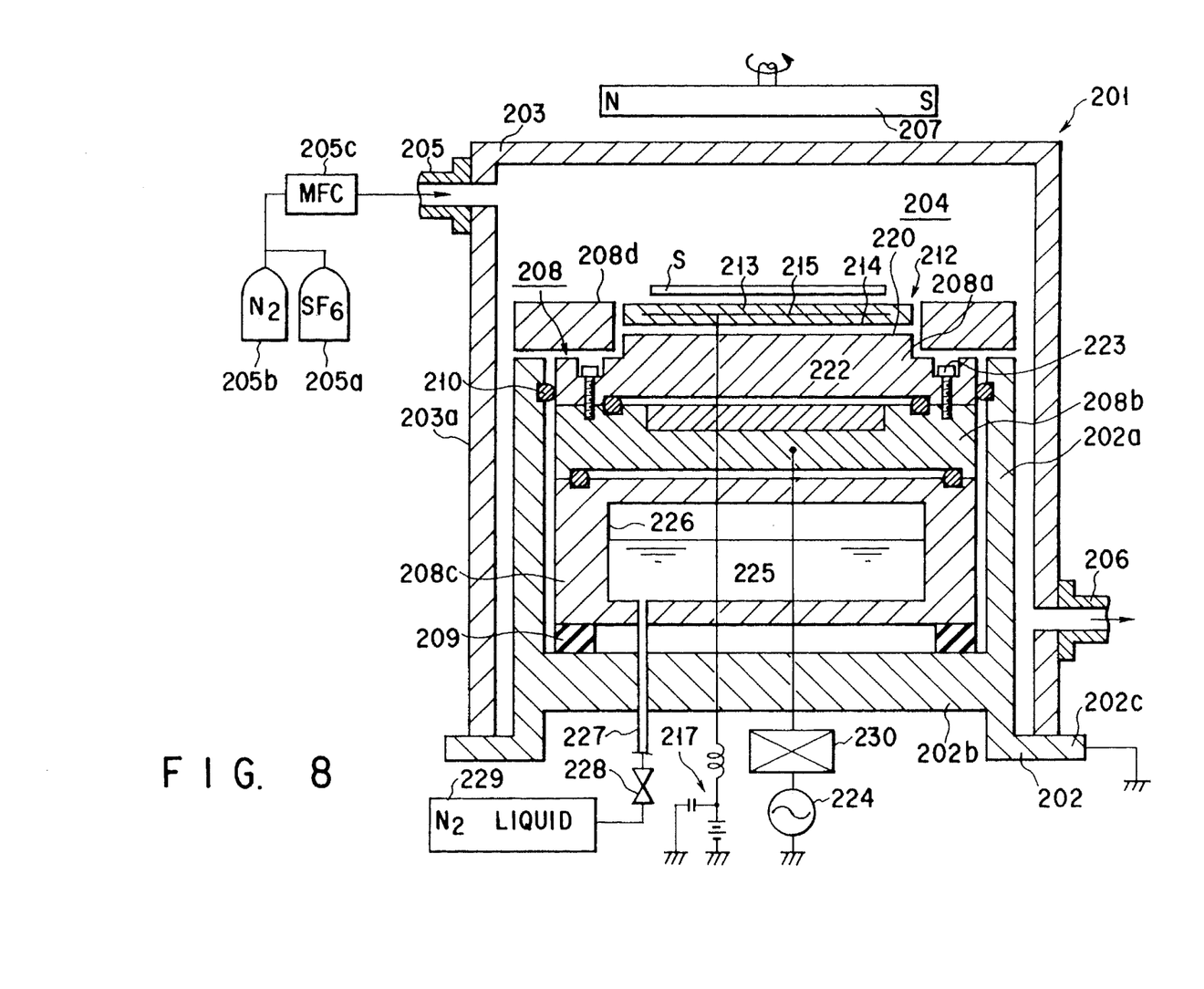
FIG. 8 is a cross-sectional view schematically showing a plasma etching apparatus according to a second embodiment of the present invention.

FIG. 8 is a cross-sectional view showing a plasma etching apparatus according to a second embodiment of the present invention. In the first embodiment, attention is paid to the process in which the temperature range is set between room temperature, e.g. 25° C., and 150° C. In the second embodiment, attention is paid to a process in which the temperature range is set between −100° C. and 60° C.

A plasma etching apparatus 201 shown in FIG. 8 includes a process chamber 204 comprising an inner frame 202 and an outer frame 203 formed of aluminum, etc. The inner frame 202 comprises a cylindrical wall portion 202a, a bottom portion 202b provided at a little distance upward from the lower end of the cylindrical wall portion 202a, and an outwardly bent flange portion 202c provided on an outer periphery of the lower end of the cylindrical wall portion 202a. On the other hand, the outer frame 203 comprises a cylindrical wall portion 203a and a top portion 203b, and is mounted on the outwardly bent flange portion 202c so as to airtightly cover the inner frame 202.

An upper portion of the cylindrical wall portion 203a of the outer frame 4 is connected to a gas supply system 205 from which a mixture gas of $SF_6$ and $N_2$ can be introduced from process gas sources, i.e. an $SF_6$ gas source 205a and an $N_2$ gas source 205b, through a mass flow controller 205c into the process chamber 204. A gas exhaust system 206 is provided on a lower part of the opposite side portion of the cylindrical wall portion 203a. The process chamber 204 can be evacuated by a vacuum pump (not shown).

A magnetic field generating device, e.g. a permanent magnet 7, for generating a horizontal magnetic field on a semiconductor wafer S or a substrate to be processed is rotatably provided above the top portion 203b of the outer frame 203. A magnetron discharge can be generated by the horizontal magnetic field generated by the magnet and an electric field produced to intersect at right angles with the horizontal magnetic field.

As is shown in FIG. 8, a susceptor assembly 208 for supporting the wafer S is situated within the process chamber 204. The susceptor assembly 208 is placed on the bottom portion 202b of the inner frame 202 via a plurality of insulating members 209. An insulating member 210 of, e.g. an O-ring shape, is interposed between the side surface of the susceptor assembly 208 and the cylindrical wall portion 202a of the inner frame 202. Thus, the susceptor assembly 208 is kept in an insulated state from the inner frame 202 and outer frame 203 which are grounded outside.

The susceptor assembly 208 has a three-layer structure. An electrostatic chuck sheet 212 is placed on a first subsusceptor 208a. The wafer S is supported on the electrostatic chuck sheet 212. A focus ring 208d of, e.g. amorphous carbon is situated on the support surface of the first susceptor 208a so as to surround the electrostatic chuck sheet 212 and wafer S, thereby efficiently radiating a generated plasma on the surface to be processed. The electrostatic chuck sheet comprises a pair of polyimide resin films 213 and 214, between which a thin conductive film 215 such as a copper foil is sealed. The conductive film 215 is connected to a DC power supply 217 via a conductive wire. A current is supplied from the DC power supply 217 so that the wafer S can be fixed on the susceptor by Coulomb force.

A second sub-susceptor 208b or an intermediate layer of the susceptor assembly 208 is provided with a heater 222 for controlling the temperature of the wafer S. The heater 222 is connected to a heat controller (not shown), and temperature control is effected in response to a signal from a temperature monitor (not shown) for monitoring the temperature of the susceptor assembly 208.

The first sub-susceptor 208a is removably fixed on the second sub-susceptor 208b by means of a coupling member such as a bolt 223. Thus, the first subsusceptor 208a alone can be exchanged, separately from the second sub-susceptor 208b connected to a high-frequency power supply 224, if the first sub-susceptor 208a is contaminated. The maintenance of the apparatus is made easier.

Since the insulating member 210 such as an O-ring is interposed between the side wall of the first sub10 susceptor 208a and the inner surface of the cylindrical wall portion 202a of the inner frame 202, the process gas introduced into the process chamber does not reach below the second sub-susceptor 208b. Thus, contamination of the intermediate and lower layers (208b and 208c) of the susceptor assembly 208 can be prevented.

A refrigerant reservoir 226 for containing a refrigerant 225 such as liquid nitrogen is provided within the third sub-susceptor 208c or the lower layer of the susceptor assembly 208. The refrigerant reservoir 226 communicates with a refrigerant source 229 via a valve 228 by means of a pipe 227. A liquid level monitor (not shown) is situated within the refrigerant reservoir 226. In response to a signal from the liquid level monitor, the valve 228 is opened and closed to control the supply amount of the refrigerant 225 within the refrigerant reservoir 226.

The susceptor assembly 208 comprising the first, second and third sub-susceptors 208a, 208b and 208c and focus ring 208d is insulated from the inner frame 202 and outer frame 203 constituting the process chamber 204 by means of the insulating members 209 and 210. The susceptor assembly 208 constitutes a cathode coupling of the electrically same polarity. The high-frequency power supply 224 is connected to the intermediate second sub-susceptor 208b via a matching device 230. Thus, the susceptor assembly 208 and the grounded outer frame 203 constitute counter electrodes. By applying a high-frequency power, a plasma discharge can be generated between the electrodes.

The results of experiments of etching in the second embodiment will now be described.

Figure 9A:
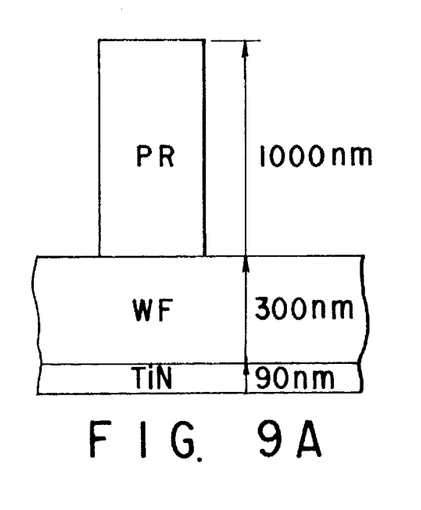
FIGS. 9A to 9C show etching configurations obtained by a conventional process and the process relating to the second embodiment.
Figure 11:
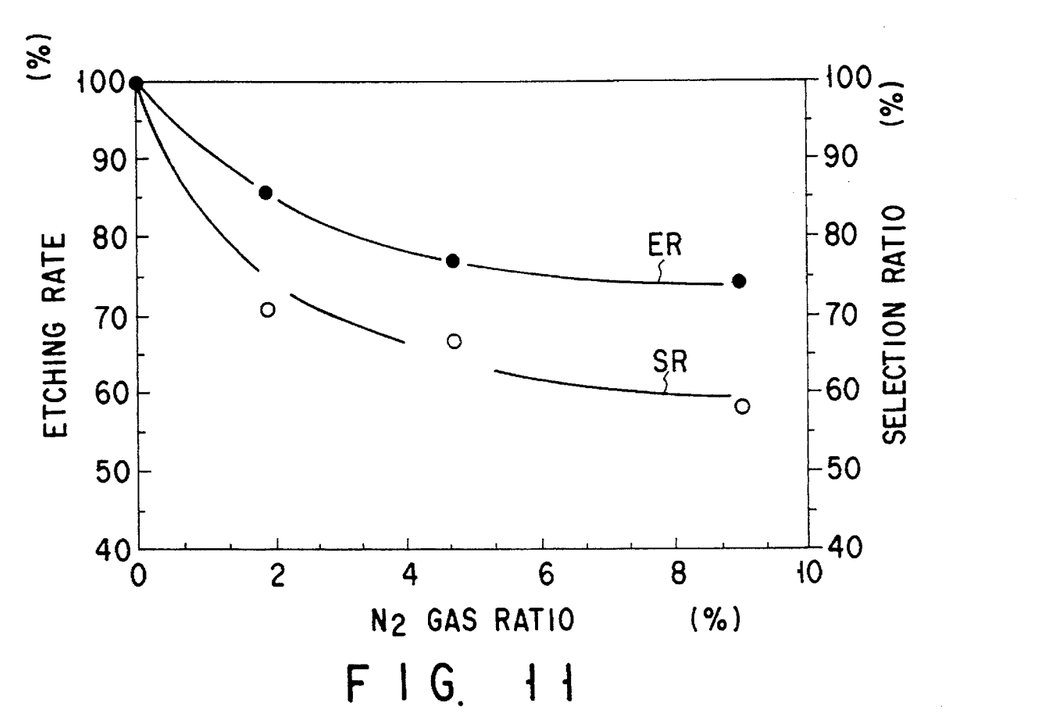
FIG. 11 is a graph showing the etching rate and etching selection ratio in the process relating to the second embodiment.
Figure 13:
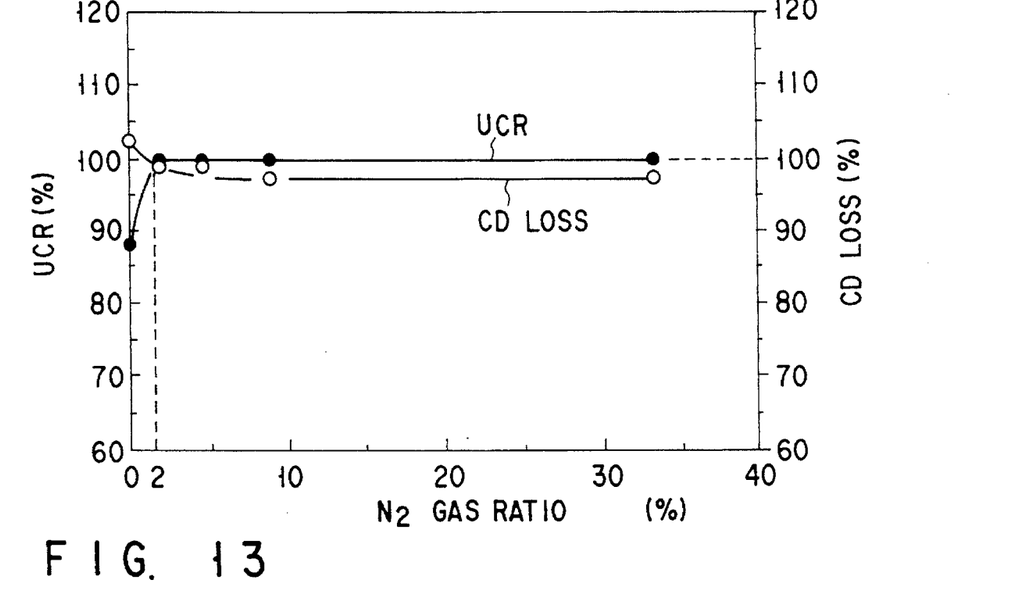
FIG. 13 is a graph showing the relationship among a variation in $N_2$ ratio, an undercut amount and a CD loss in the process of the second embodiment.
Figure 14:
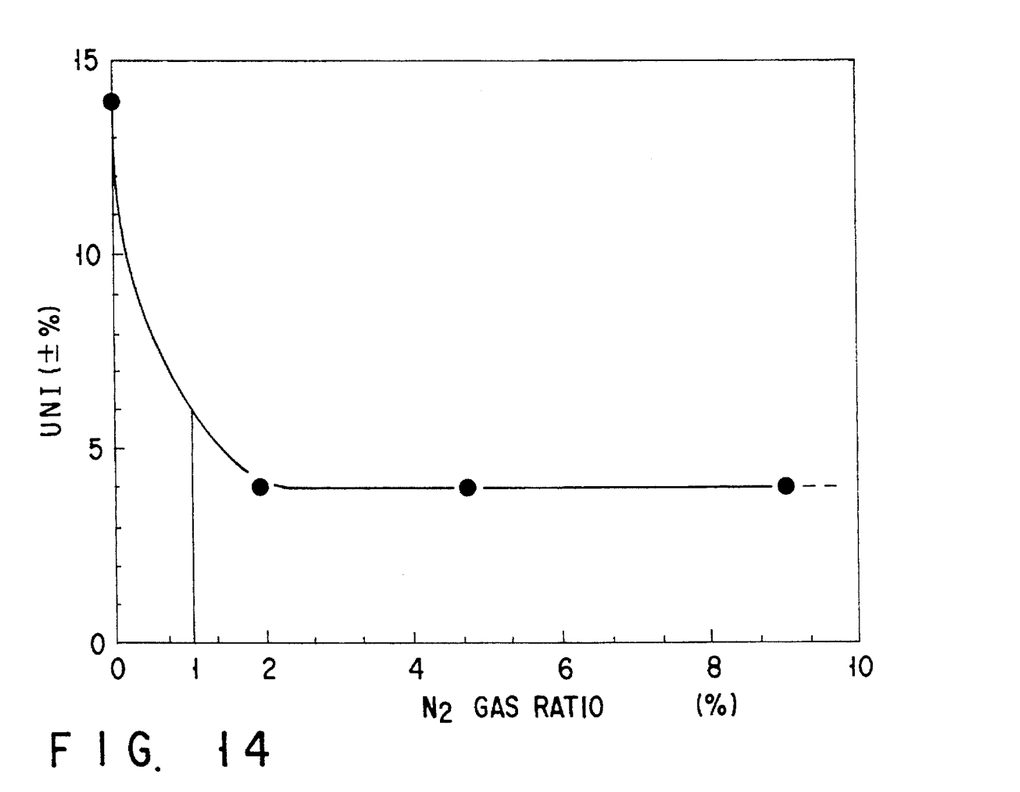
FIG. 14 is a graph showing the relationship between a variation in $N_2$ ratio and the in-plane uniformity of an etching rate in the process of the second embodiment.

An etching target employed in the experiments was shown in FIG. 9A. A 300 nm tungsten film WF was formed on a 90 nm titanium nitride film TiN. A 1000 nm photoresist film PR was laminated on the resultant. A mixture gas of $SF_6$ and $N_2$ was used as process gas. The temperature of the surface to be processed of the wafer was set at a low level, e.g. about 0° C. The pressure within the process chamber was set at several-ten Torr. The power of the high-frequency power supply was set at a low level, e.g. about 300 W. The results of etching are shown in FIGS. 11, 13 and 14.

The etching rate ER of tungsten and the etching selection ratio SR of tungsten to the photoresist were examined, with the $N_2$ ratio employed as a variable. It has been found, as shown in FIG. 11, that if a great quantity of $N_2$ is added to $SF_6$, the tungsten etching rate ER and tungsten etching selection ratio SR to the photoresist decrease. In other words, a high tungsten etching rate and a high tungsten etching selection ratio to the photoresist can be obtained by using a mixture gas in which the ratio of $N_2$ added to $SF_6$ is set at 1% to 30%, preferably 1% to 10%, more preferably 2% to 10%.

Figure 9B:
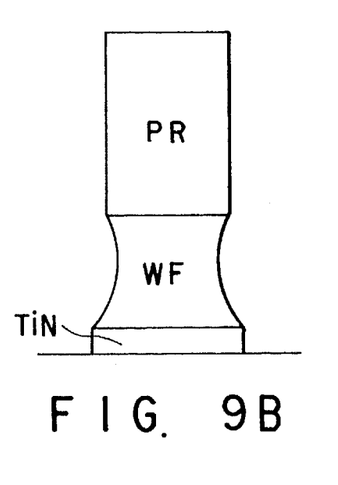
Figure 9C:
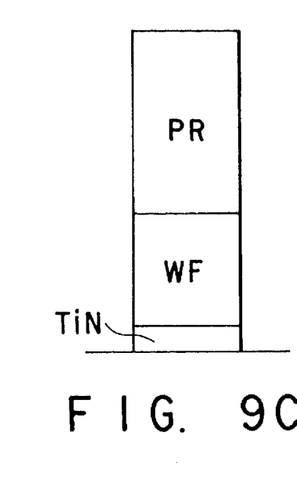
Figure 12A:
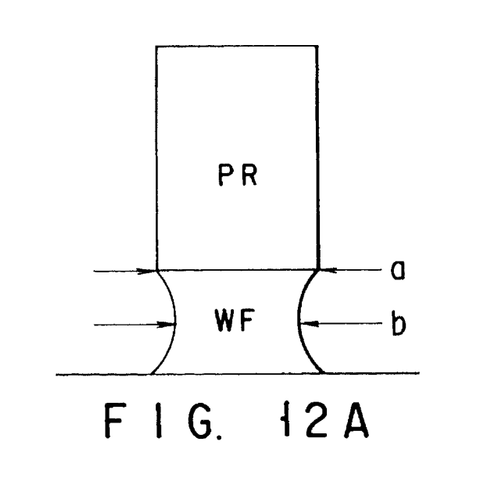
FIGS. 12A and 12B illustrate an undercut amount and a measuring method of a CD loss.
Figure 12B:
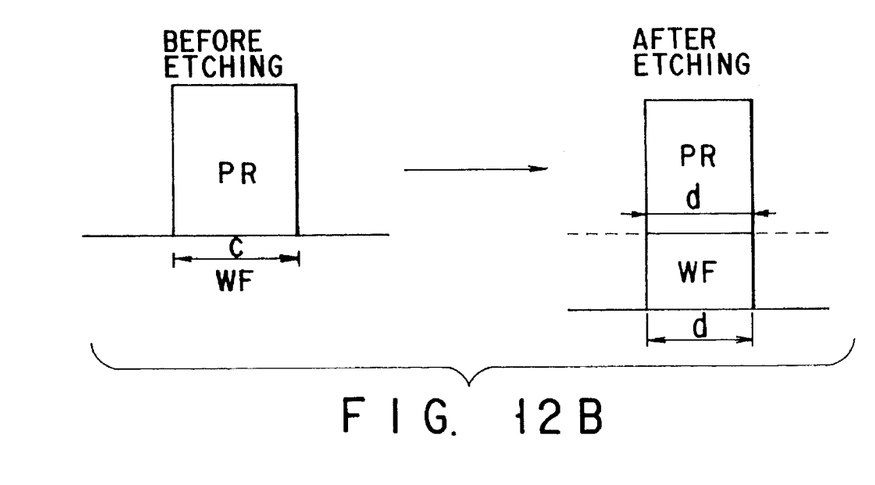

The relationship among an undercut amount UCR after tungsten etching, a dimension conversion loss (CD loss) and an $N_2$ ratio variation, as measured on the basis of standards shown in FIGS. 12A and 12B, was examined. In this case, UCR=b/a×100 (%) (FIG. 12A) or UCR=d/c×100 (%) (FIG. 12B). It has been found that when 1% or more, preferably, 2% or more, $N_2$ is added to $SF_6$, as shown in FIG. 13, tungsten etching with a good normal tapered or vertical shape, as shown in FIG. 9C, is performed. When etching was performed with $SF_6$ alone under the same conditions, an undercut as shown in FIG. 9B occurred.

The in-plane uniformity of the etching rate on the wafer surface after tungsten etching was measured on the basis of the formula (below) and the relationship between the in-plane uniformity and the variation in $N_2$ ratio was examined. In the formula, UNI indicates the in-plane uniformity (±%) of the etching rate, MxER indicates the maximum etching rate, and MiER indicates the minimum etching rate.

$$UNI=(MxER-MiER)/(MxER+MiER)\times 100$$

Figure 10:
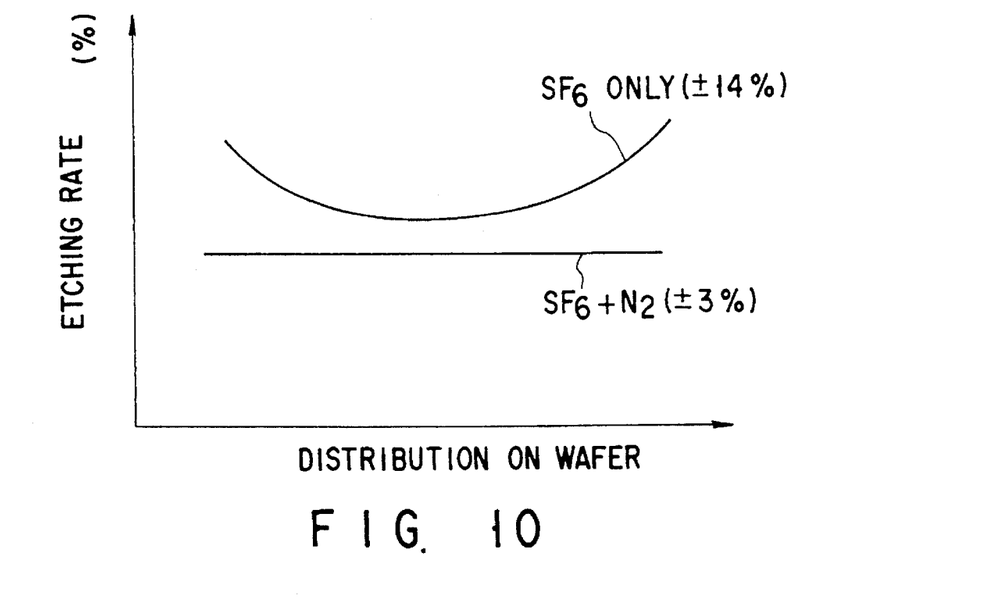
FIG. 10 shows the in-plane uniformity of the etching rate in the conventional process and the process relating to the second embodiment.

As a result in the second embodiment, it has been found that by adding 1% or more, preferably 2% or more, $N_2$ to $SF_6$, the in-plane uniformity is enhanced and a good distribution of etching rate within the wafer surface, as shown in FIG. 10, is obtained.

What is claimed is:

1. An apparatus for etching an etching target on a major surface of a substrate by using a plasma, comprising:

a process chamber defining a vacuum process space for containing and processing said substrate;

a supply system for introducing an etching gas to be made into a plasma into said process chamber;

an exhaust system for exhausting said process chamber;

a pair of counter electrodes provided within said process chamber and opposed to each other;

a support member, provided within said process chamber, for supporting said substrate such that said major surface is exposed within said process space;

a power supply for applying a voltage between said counter electrodes so as to generate an electric field for making said etching gas into a plasma; and a focus ring having a surface surrounding said major surface of the substrate, said surface of the focus ring comprising first and second surrounding surfaces exposed to said process space and located inside and outside, respectively, said first surrounding surface being formed of an electrically conductive material which produces no such a reaction product as to be substantially adsorbed on the etching target by contact with said etching gas, said second surrounding surface being formed of a material containing a component which is a main component of said etching target and produces such a reaction product as to be substantially adsorbed on the etching target by contact with said etching gas, so that said reaction product generated from said second surrounding surface diffuses to said major surface of said substrate while said plasma is being generated, thereby correcting a distribution of the amount of the reaction product on said major surface.

2. The apparatus according to claim 1, wherein said first surrounding surface is formed of a carbon-based material.

3. The apparatus according to claim 1, wherein the contour of said support member is less than that of said substrate such that a peripheral portion of the substrate supported on said support member projects from said support member, and wherein said focus ring has a portion underlying said peripheral portion of the substrate projecting from said support member.

4. The apparatus according to claim 1, wherein said first surrounding surface is flush with said major surface of said substrate.

5. The apparatus according to claim 1, further comprising:
 a heat exchange source, housed within said support member, for effecting heat exchange with said substrate;
 a controller for controlling the temperature of said heat exchange source, thereby setting the temperature of said major surface of said substrate; and
 a member for supplying a heat transfer medium gas into a gap defined between said support member and said substrate, thereby maintaining a heat transmission path between said heat exchange source and said major surface of said substrate within a vacuum atmosphere,
 wherein the temperature of said major surface of said substrate is set to be lower than that of said second surrounding surface of said focus ring while said plasma is being generated, and a distance between said second surrounding surface and said major surface of said substrate is set such that the amount of said reaction product diffused from said second surrounding surface to said major surface of said substrate is reduced while said plasma is being generated.

6. The apparatus according to claim 1, wherein the distance between said major surface of the substrate and said second surrounding surface of the focus ring is substantially constant over the entire periphery of said major surface of said substrate.

7. The apparatus according to claim 1, wherein said etching target is formed of one selected from a group consisting of W and Wsi and said second surrounding surface is formed of W.

8. The apparatus according to claim 1, wherein said etching target is formed of one selected from a group consisting of Ti, TiSi and TiN, and said second surrounding surface is formed of Ti.

9. The apparatus according to claim 1, wherein said etching target is formed of one selected from a group consisting of Al and Al—Si—Cu, and said second surrounding surface is formed of Al.

* * * * *